(12) United States Patent
Teppan et al.

(10) Patent No.: US 9,494,619 B2
(45) Date of Patent: Nov. 15, 2016

(54) ELECTRICAL CURRENT TRANSDUCER

(71) Applicant: LEM Intellectual Property SA, Fribourg (CH)

(72) Inventors: Wolfram Teppan, Wünnewil (CH); Stéphane Claeys, Chevrier (FR)

(73) Assignee: LEM Intellectual Property SA, Fribourg (CH)

( * ) Notice: Subject to any disclaimer, the term of this patent is extended or adjusted under 35 U.S.C. 154(b) by 265 days.

(21) Appl. No.: 14/353,941

(22) PCT Filed: Oct. 24, 2012

(86) PCT No.: PCT/IB2012/055838
§ 371 (c)(1),
(2) Date: Apr. 24, 2014

(87) PCT Pub. No.: WO2013/061253
PCT Pub. Date: May 2, 2013

(65) Prior Publication Data
US 2014/0300350 A1  Oct. 9, 2014

(30) Foreign Application Priority Data

Oct. 26, 2011  (EP) .................................. 11186793

(51) Int. Cl.
| G01R 33/02 | (2006.01) |
| G01R 33/04 | (2006.01) |
| G01R 15/18 | (2006.01) |
| H01F 38/30 | (2006.01) |

(52) U.S. Cl.
CPC ............. *G01R 15/18* (2013.01); *G01R 15/185* (2013.01); *H01F 38/30* (2013.01)

(58) Field of Classification Search
CPC .................................................. G01R 33/02

USPC ................................................... 324/244, 253
See application file for complete search history.

(56) References Cited

U.S. PATENT DOCUMENTS 6,388,549 B1  5/2002  Lenhard

FOREIGN PATENT DOCUMENTS

| EP | 1617228 A1 | 1/2006 |
| EP | 2083277 A1 | 7/2009 |

OTHER PUBLICATIONS

International Search Report and Written Opinion issued by the European Patent Office, dated Jan. 30, 2013, for related International Application No. PCT/IB2012/055838; 17 pages.

*Primary Examiner* — Bot Ledynh
(74) *Attorney, Agent, or Firm* — Faegre Baker Daniels LLP

(57) ABSTRACT

A closed-loop current transducer comprising a magnetic circuit, a magnetic field detector, and a compensation coil assembly configured to generate a magnetic field opposing a magnetic field created by an electrical current to be measured flowing in one or more primary conductors extending through a central opening of the magnetic circuit. The magnetic circuit comprises a first branch, a second branch, and first and second end branches, interconnecting the first and second branches such that the branches surround a central passage through which the one or more primary conductors may extend, the second branch forming a receptacle that defines a cavity extending in an axial direction A for receiving a sensing portion of the magnetic field detector, the second branch comprising two second branch portions separated by an interface resulting from the bringing together of opposed ends of a single piece magnetic circuit.

20 Claims, 6 Drawing Sheets

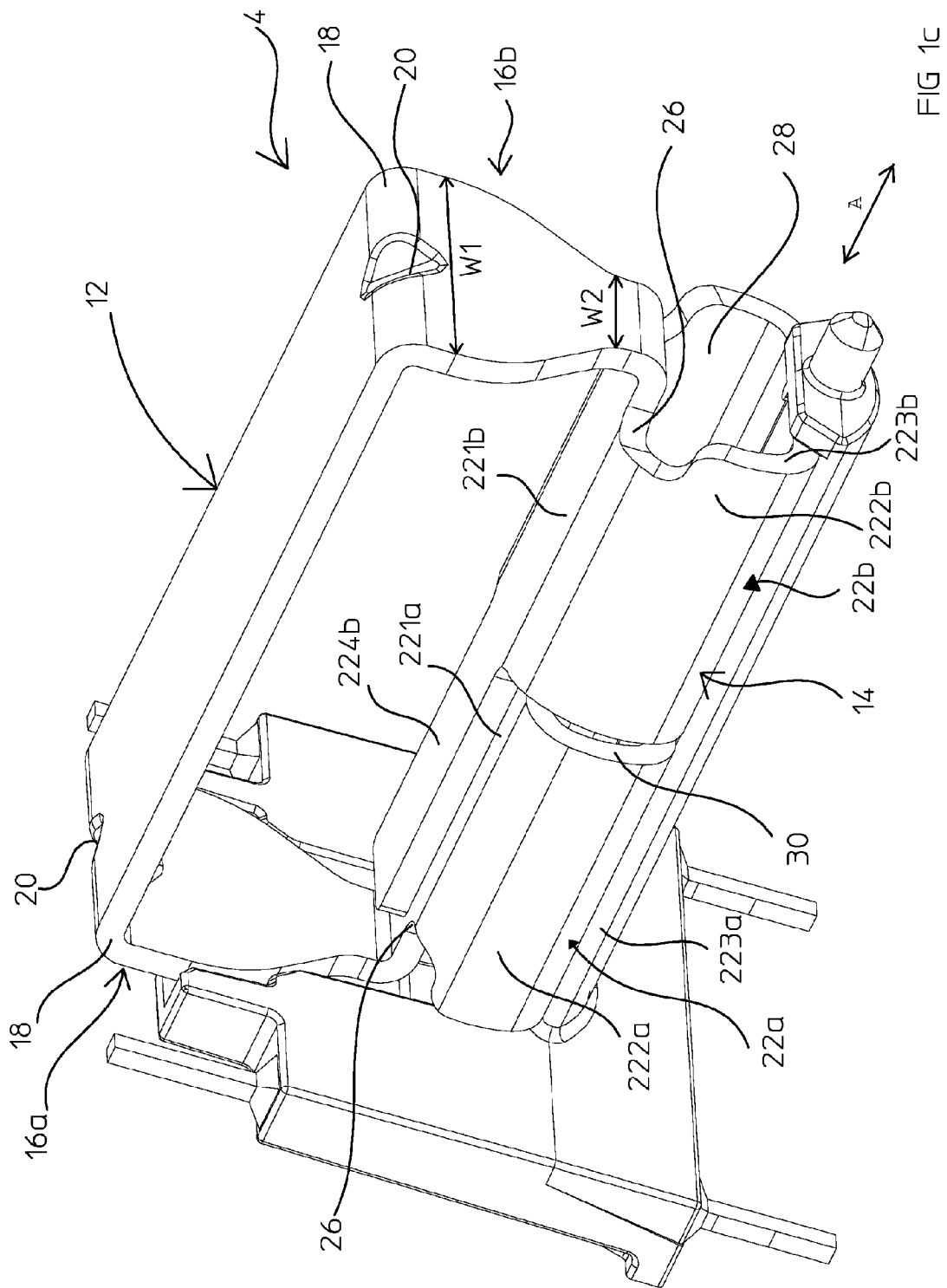

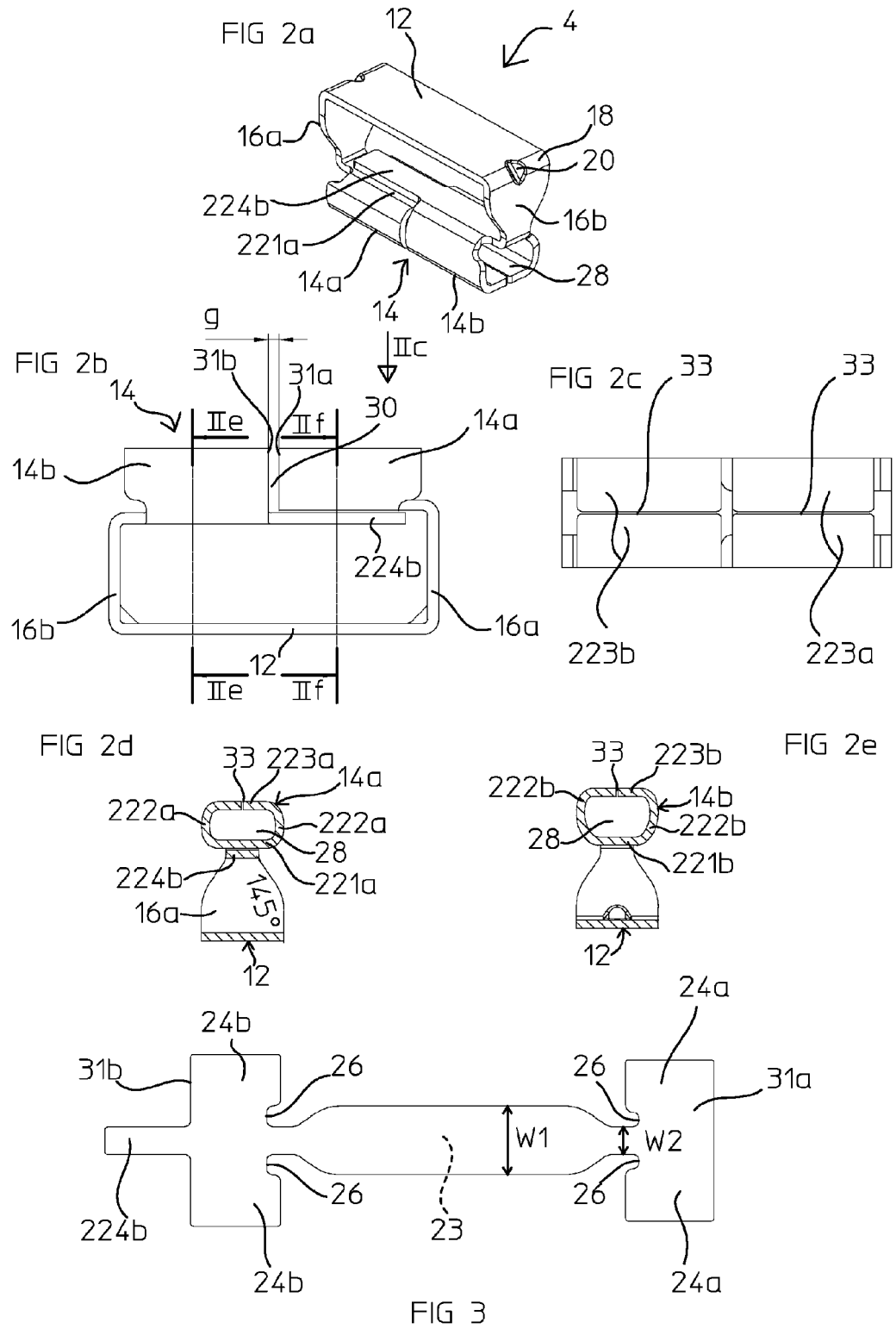

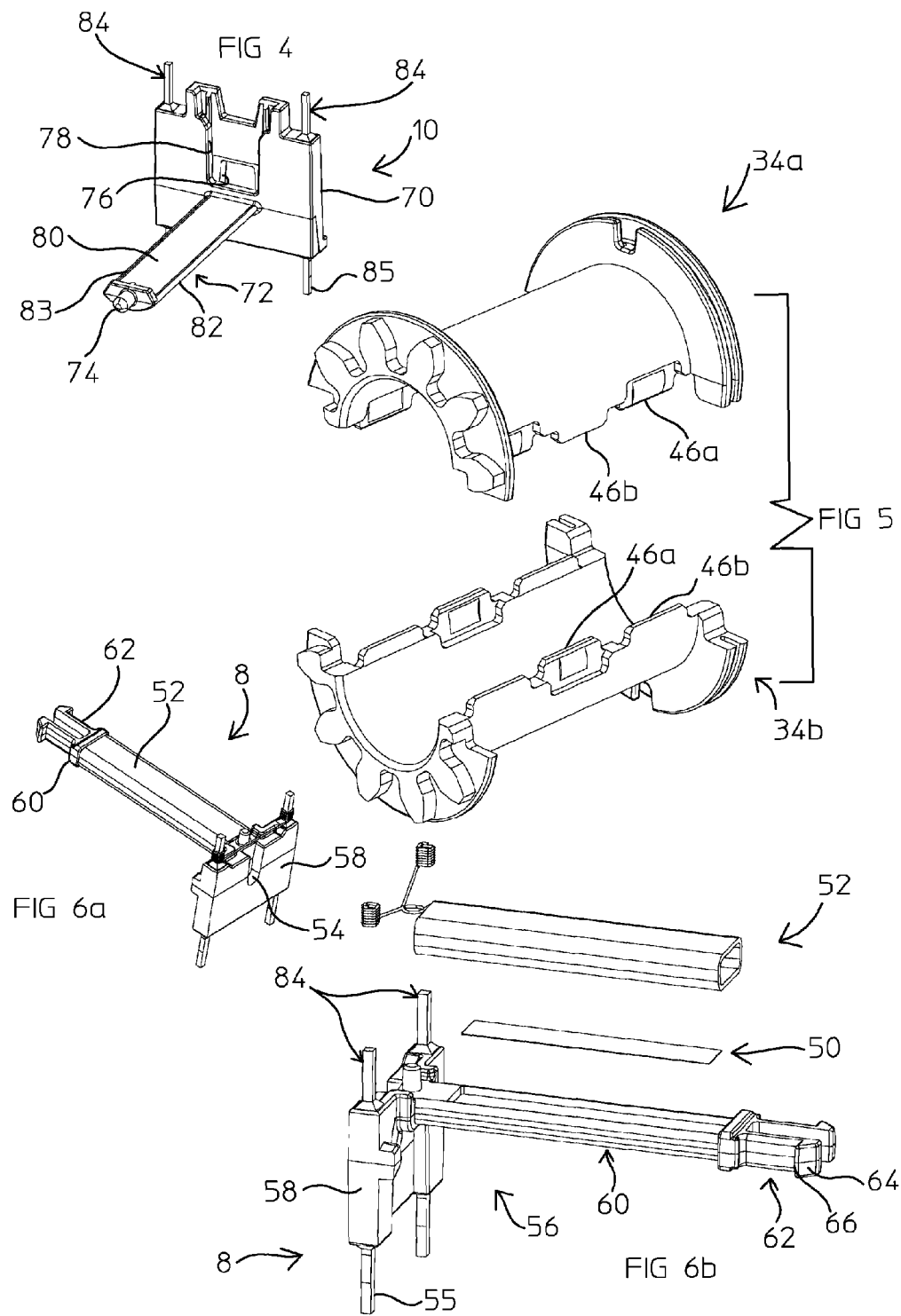

ELECTRICAL CURRENT TRANSDUCER

The work leading to this invention has received funding from the European Union's Seventh Framework Programme (FP7/2007-2013) under grant agreement no "AAT.2008.4.2.4-234119 CREAM".

The present invention relates to an electrical current transducer of the closed-loop type.

BACKGROUND OF THE DISCLOSURE

The invention concerns current sensors of the closed-loop type, having a compensation circuit with secondary coil for cancelling the magnetic flux induced in the magnetic circuit. Closed-loop current sensors are widely used in a large number of current and voltage measurement applications. In such sensors, the magnetic flux in the magnetic circuit is very low, since the compensation coil, also commonly called secondary coil, is driven in a feedback loop to cancel the magnetic field induced by the current to be measured (primary current), the resultant magnetic field being picked up by a magnetic field sensor which thus needs to have a high sensitivity for accurate and rapid response of the current sensor. Various magnetic field sensors including Hall effect detectors, pick-up coils, or fluxgate sensors, may be employed in so-called closed-loop current sensors. The magnetic field detector may be arranged in an air-gap of the magnetic circuit, or in a partial air-gap, or in proximity of an air-gap, or simply in proximity or around a branch of the magnetic circuit.

In order to reduce the influence of external magnetic fields, considering the sensitivity of certain magnetic field sensors, it is advantageous to position the magnetic field sensor within the magnetic core or alongside the inner periphery, as opposed to an outer side of the magnetic coil where external magnetic fields have a greater influence on the magnetic field sensor. A closed-loop current sensor with a sensitive magnetic field detector is for example described in German patent application DE 102005028572. In the latter publication, the current sensor has a magnetic core that is made of a uniform width strip of soft magnetic material (i.e. material with a high magnetic permeability) folded into two identical parts that are assembled together in mirror symmetry. The magnetic core has extensions forming a space therebetween within which a magnetic field fluxgate sensor is positioned. The space for the magnetic field detector is bounded by an outer pair and an inner pair of arms, the outer pair being supposedly in edge abutting relationship, and the inner pair of arms supposedly providing an air-gap. Discontinuities in the magnetic circuit, such as between the abutting outer arms of the magnetic circuit, have a parasitic air-gap effect that influences the measurement accuracy and response of the sensor. A slight variation in the degree of contact between the abutting edges, or the creation of a slight gap, may have an important effect on the magnetic flux lines and thus the measurement accuracy of the sensor. The sensor described in the aforementioned publication is thus very sensitive to assembly accuracy and repeatability. The magnetic core is made of folded strip material that has a low rigidity and requires careful handling during manufacture and assembly. Moreover, the magnetic fluxgate sensor positioned in the space between first and second pairs of arms is also somewhat exposed to external field influences from the open sides.

In EP2083277, certain of the drawbacks mentioned above are overcome, however there is a desire to further reduce manufacturing costs while increasing the performance and reliability of the transducer, which may include aspects such as measurement accuracy, large measurement operating range, reduced sensitivity to disturbing external magnetic fields, manufacturing repeatability, stability over time and usage, and robustness.

SUMMARY OF THE DISCLOSURE

It is an object of this invention to provide an electrical current transducer that is accurate and reliable and yet economical to manufacture.

It is advantageous to provide a closed-loop electrical current transducer that has a good resistance to external field influences.

It is advantageous to provide a closed-loop electrical current transducer that is robust and stable over time.

It is advantageous to provide a closed-loop electrical current transducer that is compact.

Various objects of this invention have been achieved by providing the current transducers according to the disclosed embodiments.

Disclosed herein is a closed-loop current transducer comprising a magnetic circuit, a magnetic field detector, and a compensation coil assembly comprising a compensation coil configured to generate a magnetic field opposing a magnetic field created by an electrical current to be measured flowing in one or more primary conductors extending through a central opening of the magnetic circuit, the magnetic circuit comprising a first branch, a second branch, and first and second end branches, interconnecting the first and second branches such that the branches surround a central passage through which the one or more primary conductors may extend. The second branch forms a receptacle that defines a cavity extending in an axial direction A for receiving a sensing portion of the magnetic field detector.

In a first aspect of the invention, the second branch comprises two second branch portions separated by an interface resulting from the bringing together of opposed ends of the magnetic circuit, wherein at least one of said second branch portions comprises an overlapping extension extending integrally from a wall portion of said at least one second branch portion, said extension overlapping and in contact against a wall portion of the other second branch portion. The magnetic circuit is formed integrally as a single part. The magnetic circuit may advantageously be integrally cut and formed from a strip of magnetic material.

The overlapping extension may advantageously have a length at least greater than 80% of a full length of the receptacle portion comprising the overlapped wall portion.

The end faces of the second branch portions may advantageously be separated by an air gap having a width (g) in the range of 0.1 to 1 mm.

The receptacle may advantageously comprise receptacle portions formed by lateral extensions extending laterally on either side of a central portion and folded together on an opposite side to form wall portions separated by a longitudinal gap, which may advantageously extend axially and be positioned centrally between sidewall portions.

In an advantageous embodiment, the lateral extensions comprise at inner corners, where the lateral extensions join the central longitudinal portion, notches or cut-ins reducing local deformation stresses and improving magnetic properties of the magnetic circuit. In an embodiment, the width W2 of the end branches at corners joining the second branch portions to the end branches, may be inferior to the width W1 of the end branches at corners joining the first branch and the end branches.

The magnetic circuit may advantageously comprise inwardly projecting re-enforcing indents at corners joining the first branch and the end branches.

In a second aspect of the invention, the transducer includes a magnetic circuit and compensation coil support comprising a support body comprising a connection body portion and a magnetic circuit support extension extending axially from the connection body portion configured for mounting and positioning of the second branch of the magnetic circuit thereon. Connection terminals for connecting the secondary coil of the compensation coil assembly may be mounted in the support body. The support extension may advantageously define on one side a magnetic circuit support surface against which the second branch of the magnetic circuit rests, and on an opposing side a coil bobbin guide surface configured to define a positioning surface allowing rotation of the coil bobbin around the second branch and support extension.

The support extension may advantageously comprise a ledge at a free end of the support extension distant from the connection body portion configured to define axially position the magnetic circuit on the support body, and the connection body portion may advantageously comprise a recess configured to receive therein and position one of the end branches of the magnetic circuit, both laterally and axially.

A positioning element may advantageously be provided at the free end of the support extension, configured to engage a complementary positioning element in the magnetic field detector.

In a third aspect of the invention, the magnetic field detector of the transducer includes a support body comprising a connection body portion and a magnetic sensor support extension extending in an axial direction from the connection body portion, the magnetic sensor support extension comprising at a free end thereof a fixing member configured for latching to the connection body portion of the magnetic circuit and compensation coil support. The fixing member may advantageously be in the form of elastic cantilever latch arms with latching protrusions.

In a fourth aspect of the invention, the compensation coil assembly of the transducer comprises a coil wound around a coil bobbin comprising at least two shell portions configured for assembly around the second branch of the magnetic circuit, the coil bobbin comprising a cylindrical central portion, a connection end flange at an axial end of the central portion and a gear flange at another axial end of the central portion, the gear flange comprising a plurality of teeth configured for coupling to a gear of a coil winding machine during assembly of the current transducer for winding the coil on the bobbin after assembly of the bobbin on the magnetic circuit. The two bobbin portions may advantageously comprise fixing elements in the form of inter-engaging fixing or positioning means that allow the bobbin portions to be assembled together around the second branch portion of the magnetic circuit.

The connection end flange may advantageously comprise a circumferential slot that serves to contain the beginning of the wire during the winding process, because it is connected to its pin after the winding process is completed

BRIEF DESCRIPTION OF THE DRAWINGS

Further objects and advantageous aspects of the invention will be apparent from the claims, the following detailed description, and drawings in which:

FIG. 1c is a view in perspective similar to FIG. 1b, with the coil winding support removed;

FIG. 2a is a view in perspective of a magnetic circuit of a current transducer according to an embodiment of this invention;

FIG. 2b is a side view of the magnetic circuit;

FIG. 2c is a view in the direction of arrow IIc of FIG. 2b;

FIGS. 2d and 2e are cross-sectional views through lines IId-IId and IIe-IIe respectively of FIG. 2b;

FIG. 3 is a plan view of a developed magnetic circuit of FIG. 2a prior to bending and forming thereof;

FIG. 4 is a view in perspective of a magnetic circuit and compensation coil support of a current transducer according to an embodiment of this invention;

FIG. 5 is an exploded perspective view of a coil bobbin of a compensation coil assembly of a current transducer according to an embodiment of this invention;

FIG. 6a is a view in perspective of a magnetic field detector of a current transducer according to an embodiment of this invention;

FIG. 6b is an exploded perspective view of a magnetic field detector of FIG. 6a; and FIGS. 7a to 7f are perspective views illustrating various steps during assembly of the current transducer embodiment illustrated in FIG. 1a.

DETAILED DESCRIPTION

Figure 1A:
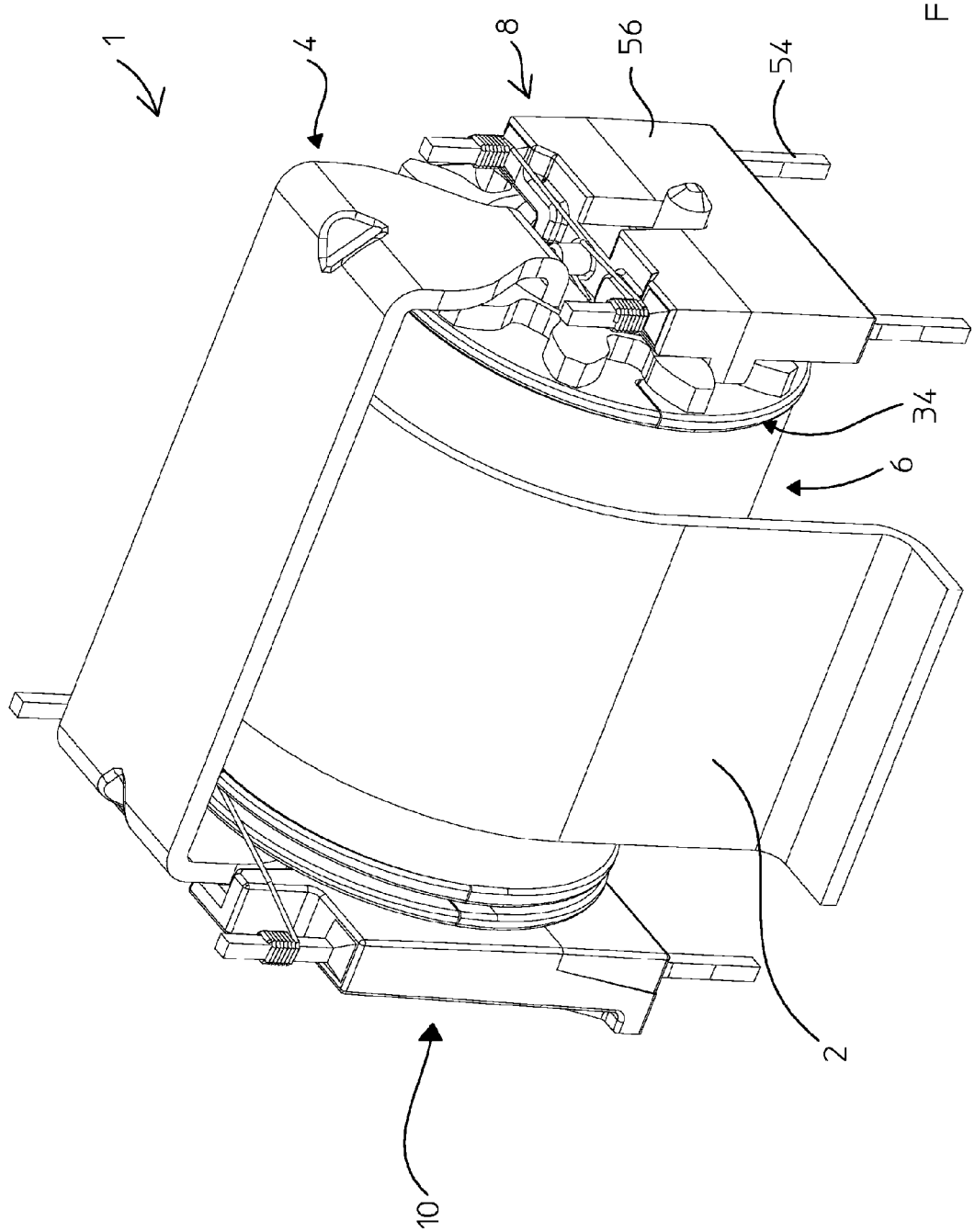
FIG. 1a is a view in perspective of a current transducer according to an embodiment of this invention with the housing removed.
Figure 1B:
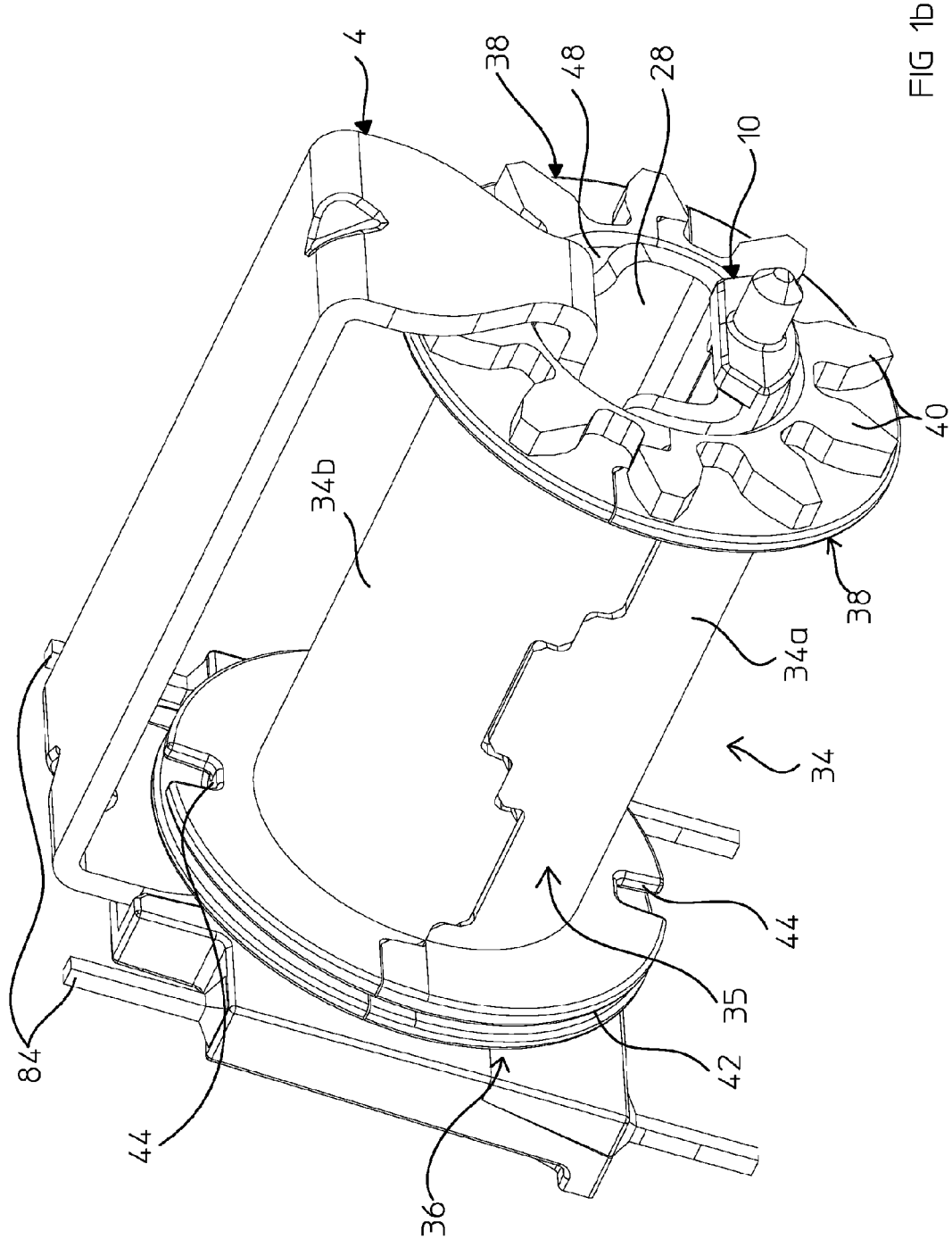
FIG. 1b is a view in perspective similar to FIG. 1a, with the primary conductor, compensation coil winding and magnetic field detector removed.
Figure 7A:
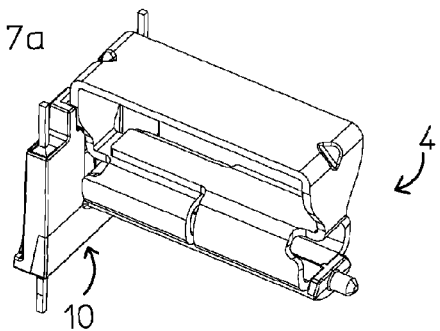
Figure 7B:
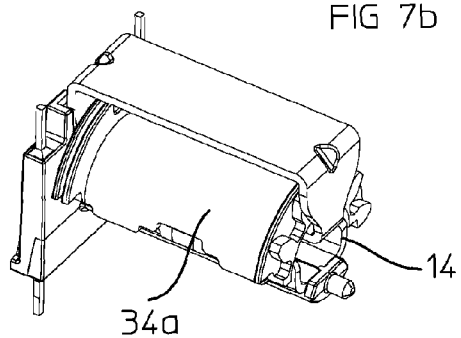
Figure 7C:
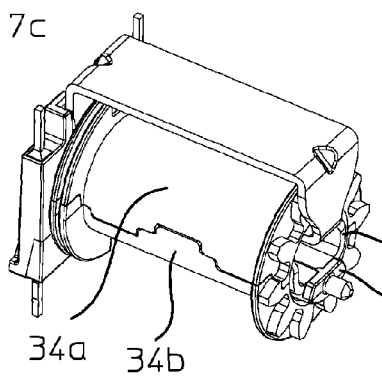
Figure 7D:
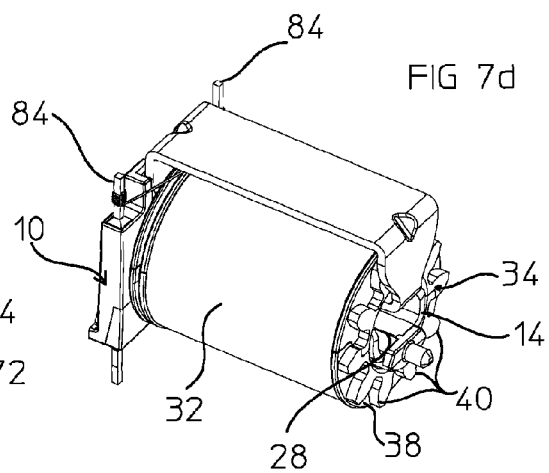
Figure 7E:
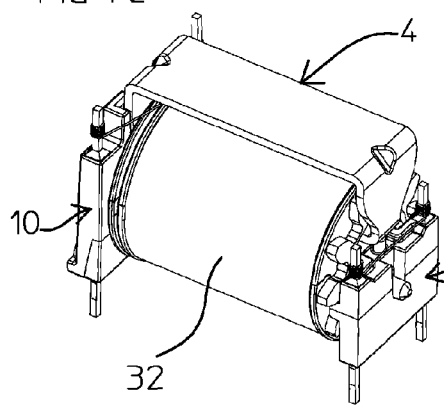
Figure 7F:
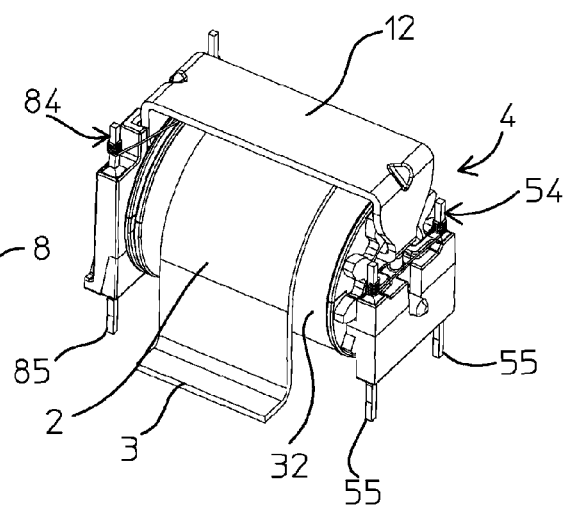

Referring to the Figures, in particular FIGS. 1a to 1c, an electrical current transducer 1 according to an embodiment of this invention for measuring the current flowing through a primary conductor 2, comprises a magnetic circuit 4, a magnetic field detector 8, and a compensation coil assembly 6 (also sometimes referred to as a secondary coil or winding assembly). The compensation coil assembly is configured to be connected to a signal processing circuit (not shown) to generate a magnetic field opposing a magnetic field created by the current to be measured (also sometimes referred to as the primary current) flowing through the primary conductor 2. The feedback signal to drive the compensation or secondary coil is generated by the magnetic field detector according to a per se well-known operating principle of closed loop type current transducers.

The magnetic circuit 4, according to the exemplary embodiment illustrated, comprises a first branch 12, a second branch 14, and first and second end branches 16a, 16b, interconnecting the spaced apart and essentially parallel first and second branches 12, 14, such that the branches surround a central passage through which the primary conductor 2 may extend. The branches thus form a circuit with low magnetic reluctance configured to conduct the magnetic flux and concentrate the magnetic field generated by the primary current flowing in the primary conductor. The magnetic circuit 4 is advantageously formed as a single part, in particular integrally formed from a piece of strip or sheet metal with the desired magnetic properties, most advantageously stamped and formed from a planar piece of sheet or strip of magnetic material. The developed shape (i.e. unfolded planar shape of the magnetic circuit according to an advantageous embodiment is illustrated in FIG. 3, such shape for example being cut out of a planar sheet of magnetic material and bent and formed into the final shape illustrated in FIGS. 2a to 2e.

The second branch 14 of the magnetic circuit forms a receptacle 22 that defines a cavity 28 extending in an axial direction A for receiving a sensing portion of the magnetic field detector 8 therein. The second branch 14 comprises two portions, hereinafter called second branch portions 14a, 14b, that are separated by an interface resulting from the bringing together of opposed ends of the single piece magnetic circuit, whereby this interface creates a disturbance of the magnetic field lines circulating in the magnetic circuit and that is picked up by the magnetic field detector for the measurement function. The disturbance to the magnetic field created by the interface between the second branch portions 14a, 14b, is controlled inter alia by a purposely dimensioned axial gap 30 between orthogonal end faces 31 of the second branch portions 14a, 14b, respectively, the gap having a width g that may advantageously be in the range of 0.1 to 0.9 mm, more preferably in the range of 0.2 to 0.7 mm. This gap provides a high impedance to the magnetic flux such that the magnetic flux flows through an overlapping portion 224b of the second branch creating contact between the branch portions. The effect of the axial gap on the magnetic field is quite insensitive to slight dimensional variations in the length g of the axial gap in view of the very high impedance of the gap relative to the impedance of overlapping portion 224b in contact with the branch portion 14b. This enables the overlapping portion of the second branch creating contact between the branch portions to generate a well controlled disturbance on the magnetic field so that some magnetic field lines extend into the axial cavity 28.

In an exemplary advantageous embodiment, the overlapping contact is formed by an extension 224b extending integrally from a wall portion 221b of the second branch portion 14b, the extension arranged on an inner side of the magnetic circuit overlapping and in contact against a wall portion 221a of the second branch portion 14a. A large proportion of the magnetic flux will thus circulate around the magnetic circuit and through the contact interface between the overlapping extension 224b and wall portion 221a and a negligible small proportion through the relatively high magnetic impedance gap 30 that has the effect of generating a controlled disturbance on the magnetic flux detected by the magnetic field detector positioned in the axial cavity 28. The extension 224b may advantageously have a length essentially equal, or at least greater than 80% of the full length of the receptacle portion comprising the overlapped wall portion 221a.

The receptacle 22 comprises receptacle portions 22a, 22b, one in each second branch portion 14a, 14b, each receptacle portion formed by lateral extensions 24a, 24b extending laterally on either side of the wall portions 221a, 221b, going around into sidewall portions 222a, 222b and coming together on an opposite side to form wall portions 223a, 223b separated by a longitudinal gap 33. The longitudinal gap 33 also has a relatively high magnetic impedance compared to the contact interface between the overlapping extension 224b and wall portion 221a and thus has small disturbance effect on the magnetic flux detected by the magnetic field detector positioned in the axial cavity 28. In view of the axial orientation of the longitudinal gap 33 and the centre symmetry along the second branch 14, the magnetic field disturbance effect of the longitudinal gap is easily controlled.

The above described configuration provides a magnetic circuit 4 that confers excellent shielding with respect to undesired external magnetic field effects and at the same time provides an accurate, easy to control magnetic field within the cavity 28 of the magnetic circuit in a structural configuration that is cost effective to manufacture and assembly. The magnetic circuit may in particular be easily formed by stamping and forming out of sheet metal in a particularly cost effective manner for large series production. The overlapping extension and axial gap provide a controlled magnetic field disturbance that is relatively insensitive to manufacturing tolerances and thus cost effective to produce while providing an accurate and reliable transducer.

In a variant (not shown), the axial extension forming the overlapping contact may be positioned on the outer side 223a, 223b of the magnetic circuit. In a variant, each receptacle portion may be formed by lateral extensions bent inwards towards the central cavity of the magnetic circuit such that the longitudinal gap separating the lateral extensions is positioned on an inside of the magnetic circuit (as opposed to an outside as shown in the exemplary embodiment illustrated in the figures).

The lateral extensions 24a, 24b may advantageously extend from a central longitudinal portion 23 of the magnetic circuit and comprise at inner corners, where the lateral extensions join the central portion, notches or cut-ins 26 that improve the magnetic properties of the material by reducing deformation stresses, and moreover allow the receptacle portions to extend along essentially or almost the whole length of the second branch 14. As can be seen in FIGS. 1c, 2a, and 3, the corner notches 26 result in a reduced width W2 of the end branches 16a, 16b, at the corners 24 joining the second branch portions 14a, 14b, as compared to the width W1 of the magnetic circuit at corners 18 joining the first branch 12 and end branches 16a, 16b. The corners 18 may advantageously be provided with re-enforcing indents 20 that improve the mechanical rigidity and dimensional accuracy of the magnetic circuit. The indents 20 may advantageously be formed within the corners 18, projecting inwardly from the outside of the corners 18 towards the central cavity of the magnetic circuit.

When the magnetic circuit is fully assembled within the transducer, the overlapping extension 224b may press positively against the wall portion 221a of the second branch portion 14a. The latter pressing together may be effected by means of the compensation winding bobbin 34 that is described further on, or by other pressing or clamping means, such as a band of dielectric tape wound around the second branch. The latter ensures that the contact over the portion of the interface defined by the extension 224b is well controlled.

Referring to FIGS. 1b and 5, the compensation coil assembly 6 comprises a coil 32 wound around a coil bobbin 34, comprising at least two portions 34a, 34b configured for assembly around the second branch 14 of the magnetic circuit. The coil bobbin is preferably made of two relatively movable portions, but may also be made of three or more parts. As best illustrated in FIG. 5, the bobbin portions 34a, 34b may form generally semi-cylindrical shell portions that are separately formed and that comprise fixing elements 46a, 46b, for instance in the form of inter-engaging latches or clips that allow the bobbin portions to be clipped together around the second branch portion of the magnetic circuit. In a variant, the bobbin portions 34a, 34b may be integrally formed, for example by injection molding, connected together there along one edge by a flexible hinge, the two shell portions being brought together to be clipped around the magnetic circuit branch. Other configurations and mechanical means for assembling and holding together the bobbin portions 34a, 34b may also be employed. The coil bobbin may thus advantageously be assembled around the branch of the magnetic circuit, thus allowing the magnetic circuit to be fully formed, or made of a single part, prior to assembly of the magnetic circuit with other elements of the transducer.

The bobbin comprises a cylindrical central portion 35 and at one axial end a flange 36, hereinafter called connection end flange, and at the other axial end a flange 38, hereinafter called gear end flange. The flanges 36, 38 form support end walls that define the length of the coil wound around the cylindrical central portion 35. The cylindrical central portion 35 is hollow and has a cylindrical, axially extending cavity 48 dimensioned to snugly receive the second branch 14 of the magnetic circuit and a support extension 72 (that will be described later on) therein, but to allow rotational sliding of the bobbin around the magnetic circuit branch 14 during the compensation coil winding process. The gear end flange 38 comprises a plurality of teeth 40, advantageously in the form of gear teeth on an outer side of the flange opposed to an inner side adjacent the coil, that is configured for coupling to a gear of a coil winding machine (not shown) during assembly of the current transducer for winding the coil on the bobbin after assembly of the bobbin on the magnetic circuit. The connection end flange 36 may advantageously comprise a circumferential slot 42 that serves as a temporary wire storage means 42 for the starting end of the winding wire. A slot 44 in an inner wall of the flange 36 serves as a wire outlet that allows the starting end of the coil to be fed through the slots 44 into the wire guide, tensioned around the wire guide and then wrapped around or connected by other means (known per se) to a terminal 84 of the magnetic circuit and compensation coil support 10 that will be described further on.

Referring in particular to FIGS. 1c and 4, the magnetic circuit and compensation coil support 10 comprises a support body 68 and connection terminals 84 for connecting the coil to a signal processing circuit (not shown). The support body 68 comprises a connection body portion 70 in which the terminals 84 are mounted, and a magnetic circuit support extension 72 extending axially from the connection body portion 70. The support body 68 may advantageously be formed of a single part, for instance an injection-molded plastic part, in which the terminals 84 are overmolded or inserted. The connection body portion 70 which is generally orthogonally positioned with respect to the axial direction A corresponding to the longitudinal direction of the second branch 14b of the circuit, may advantageously comprise a recess 78 configured to receive therein and position one of the end branches 16a of the magnetic circuit, both laterally and axially, the axial position of the magnetic circuit being further defined in conjunction with a ledge 83 at a free end of the support extension 72 distant from the connection body portion. The connection body portion 70 and ledge 83 thus also help to define and/or ensure a controlled length g of the air-gap 30 of the magnetic circuit between end faces 31a, 31b.

The support extension 72 defines on one side a magnetic support surface 80 against which the second branch 14 of the magnetic circuit rests, and on an opposing side a bobbin guide surface 82 that is curved to define a low-friction positioning surface allowing rotation of the bobbin around the second branch 14 and support extension 72. A positioning element 74, for instance in the form of a pin as illustrated, may be provided at the free end of the support extension, configured to engage a complementary positioning element 54 (see FIG. 6a) in the magnetic field detector 8, that will be described herebelow. The connection body portion 70 further comprises a fixing member 76 that cooperates with a complementary fixing member 62 of the magnetic field detector, in order to position and fix the magnetic field detector to the magnetic circuit and compensation coil support. In the example illustrated, the fixing member 76 on the connection body portion is in the form of an orifice 76 providing edges or shoulders for latching of latching shoulders 66 on elastic arms extending from a free end of the magnetic field detector 8.

The magnetic field detector 8, in the illustrated embodiment, is of the fluxgate type, the functioning principle of which is per se well-known. Other magnetic field detector types could be employed, for instance magneto-resistive or Hall effect. In a current transducer according to the invention, a fluxgate type magnetic field detector is particularly advantageous in view of its high sensitivity and accuracy. The exemplary fluxgate magnetic field detector 8 comprises an excitation coil 52 and a strip or band of amorphous high-permeability magnetic material 50 configured to saturate alternatingly under the influence of an alternating magnetic field generated by the excitation and detection coil 52 wound around the magnetic material. The magnetic field detector comprises a support body 56, for instance made of an injected plastic material, comprising a connection body portion 58 and a support extension 60 extending an axial direction from the connection body portion. The magnetic material 50 is positioned and supported on the extension 60 and around which the excitation coil 52 is wound. One end of the extension 60 is connected to the connection body portion 58, for instance integrally molded therewith, whereby terminals 84 are mounted in the connection body portion 58 and are configured to be connected to ends of the excitation coil 52. For instance, the terminals 84 may be in the form of pins having connection posts 54 for connection to the excitation coil ends by various known means (for example a wrap connection, a solder connection, welding, or other known connection means), the other end of the terminals being configured for connection to a signal processing circuit (not shown), for instance provided with surface mount portions for soldering on conductive pads of a circuit board.

At a free end of the support extension 60 is arranged the fixing member 62 described above, that is configured for latching to the connection body portion 70 of the magnetic circuit and compensation coil support 10 when the magnetic field detector is assembled to the other components of the transducer. In the assembled state, the positioning element 74 of the magnetic circuit and compensation coil support 10 engages in the complementary positioning element 59 of the magnetic field detector, which in this case is a recess or cavity 59 complementary to a pin 74. The magnetic field detector is thus assembled to the other transducer components by inserting the support extension 60 into the axial cavity 28 of the magnetic circuit until the fixing member 62 of the magnetic field detector engages with the fixing member 76 of the magnetic circuit and compensation coil support 10 and securely locks the two components together in the assembled position. The fixing member 62 may be advantageously in the form of elastic cantilever latch arms with tapered latching protrusions 64 providing latching shoulders 66 that engage complementary latching shoulders formed by the edge of the orifice 76 in the connection body portion 70. Other latching mechanisms could be provided.

Referring to FIGS. 7a to 7f, examples of steps in an assembly process of an embodiment are illustrated. In a step illustrated in FIG. 7a, the formed magnetic circuit 4 is positioned on the magnetic circuit and compensation coil support 10. In a subsequent step illustrated in FIG. 7*b*, a bobbin portion 34*a* of the coil bobbin 34 is inserted through the central passage of the magnetic circuit and positioned over the second branch 14, and in a subsequent step illustrated in FIG. 7*c*, the second bobbin portion 34*b* is assembled to the first bobbin portion 34*a* from the other side of the second branch 14 of the magnetic circuit, whereby the inter-engaging clips 46*a*, 46*b* (shown in FIG. 5) of the bobbin portions latched together to securely hold the body portion around the second branch 14 and support extension 72. In a subsequent step, a wire forming the compensation coil assembly 32 is wound around the coil bobbin 34 by rotating the coil bobbin around the magnetic circuit second branch 14 by means of a toothed tool engaging the gear teeth 40 on the flange 38 of the coil bobbin, as previously described. Wire ends of the coil are connected to the terminals 84 of the magnetic circuit and compensation coil support 10. In the step illustrated in FIG. 7*e*, the magnetic field detector 8 is assembled by inserting the extension 60 (shown in FIG. 6*a*) in the magnetic circuit cavity 28, as described above. In the step illustrated in FIG. 7*f*, a primary conductor 2 is inserted through the central cavity of the magnetic circuit, in the space between the first branch 12 and the compensation coil assembly 32, the primary conductor forming a U-shape around the compensation coil assembly 32 and provided with connection ends 3 arranged on the same side of the transducer as signal processing circuit connection ends 85 and 55 of the terminals 84 and 54 of the compensation coil assembly and magnetic field detector respectively. The primary conductor 2 may be pre-assembled in the transducer thus forming an integral part of the transducer. The primary conductor may comprise a single conductor or there may be one or more primary conductors extending through the magnetic circuit, or the primary conductor may comprise one or more turns around the magnetic circuit branch as is per se known in the art. In a variant, the transducer may be provided with a through-passage extending through the magnetic circuit, through which a primary conductor may be inserted that is not part of the transducer.

LIST OF REFERENCES IN THE FIGURES 2 primary conductor
3 connection ends
1 electrical current sensor
4 magnetic circuit core
12 first branch
14 second branch
14*a*, 14*b*, second axial branch portions
22 receptacle
22*a*, 22*b* receptacle portions
24*a*, 24*b* lateral extensions
221*a*, 222*a*, 223*a* wall portions (of receptacle portion 22*a*)
221*b*, 222*b*, 223*b* wall portions (of receptacle portion 22*b*)
224*b* extension (overlapping wall portion 221*a*)
28 axial cavity
30 axial gap
16*a* first end branch
16*b* second end branch
18 corners (joining first and end branches)
20 indent
24 corners (joining second and end branches)
26 cut-in
6 compensation coil assembly
32 compensation coil
32*a*, 32*b* connection ends
34 compensation coil (support) bobbin
34*a*, 34*b* bobbin portions
35 cylindrical central portion
36 flange (connection end)
42 wire guide
44 wire inlet
38 flange (winding operation end)
40 (gear) teeth
46*a*, 46*b* fixing elements (interengaging latches/clips)
48 cylindrical cavity
8 magnetic field detector
50 saturable magnetic material (strip/band of amorphous magnetic material)
52 excitation and detection coil
54 terminals
55 external circuit connection end
56 support body
58 connection body portion
59 positioning element (orifice for positioning pin 74)
60 magnetic material support extension (axial extension)
62 fixing member (elastic latch/clip arms)
64 tapered lead in
66 latching shoulder
10 magnetic circuit and compensation coil support
68 support body
70 connection body portion
76 fixing member (orifice for latch arms 62)
78 (magnetic circuit) end branch guide/positioning cavity
72 magnetic circuit support extension (axial extension)
83 ledge
74 positioning element (pin for orifice 59)
80 magnetic circuit support surface
82 bobbin (rotary) guide surface
84 terminals
85 external circuit connection end

The invention claimed is:

1. A closed-loop current transducer comprising a magnetic circuit with low magnetic reluctance configured to conduct magnetic flux and concentrate a magnetic field, a magnetic field detector, and a compensation coil assembly configured to generate a magnetic field opposing a magnetic field created by an electrical current to be measured flowing in one or more primary conductors extending through a central opening of the magnetic circuit, the magnetic circuit comprising a first branch, a second branch, and first and second end branches interconnecting the first and second branches such that the branches surround said central opening, the second branch comprising a receptacle that defines a cavity extending in an axial direction A for receiving a sensing portion of the magnetic field detector, the second branch comprising two second branch portions separated by an interface resulting from the bringing together of opposed ends of the magnetic circuit, wherein the receptacle comprises receptacle portions, one in each second branch portion, each receptacle portion formed by two lateral extensions extending laterally on each side of the wall portions, going around into sidewall portions and coming together on an opposite side to form wall portions separated by a longitudinal gap, and wherein the magnetic circuit is integrally formed as a single part and at least one of said second branch portions comprises an overlapping extension extending integrally from a wall portion of said at least one second branch portion, said extension overlapping and in contact against a wall portion of the other second branch portion.

2. The transducer according to claim 1, wherein the magnetic circuit is integrally cut and formed from a strip of magnetic material.

3. The transducer according to claim 1, wherein end faces of the second branch portions are separated by an air gap having a width (g) in the range of 0.1 to 1 mm.

4. The transducer according to claim 1, wherein the overlapping extension is arranged on an inner side of the magnetic circuit.

5. The transducer according to claim 1, wherein the lateral extensions extend from a central longitudinal portion of the magnetic circuit and comprise at inner corners, where the lateral extensions join the central longitudinal portion, notches or cut-ins.

6. The transducer according to claim 1, wherein the longitudinal gap extends axially and is positioned centrally between said sidewall portions.

7. The transducer according to claim 1, wherein the overlapping extension has a length at least greater than 80% of a full length of the receptacle portion comprising the overlapped wall portion.

8. The transducer according to claim 1, wherein a width W2 of the end branches at corners joining the second branch portions to the end branches, is inferior to a width W1 of the end branches at corners joining the first branch and the end branches.

9. The transducer according to claim 1, wherein the magnetic circuit comprises re-enforcing indents at corners joining the first branch and the end branches, said indents projecting inwardly from an outside of the corners towards the central opening of the magnetic circuit.

10. The transducer according to claim 1 further including a magnetic circuit and compensation coil support comprising a support body comprising a connection body portion and a magnetic circuit support extension extending axially from the connection body portion configured for mounting and positioning of the second branch of the magnetic circuit thereon.

11. The transducer according to claim 10, wherein connection terminals for connecting a compensation coil of the compensation coil assembly are mounted in the support body.

12. The transducer according to claim 10, wherein the support extension comprises a ledge at a free end of the support extension distant from the connection body portion configured to axially position the magnetic circuit on the support body.

13. The transducer according to claim 10, wherein the connection body portion comprises a recess configured to receive therein and position one of the end branches of the magnetic circuit, both laterally and axially.

14. The transducer according to claim 10, wherein the support extension defines on one side a magnetic circuit support surface against which the second branch of the magnetic circuit rests, and on an opposing side a coil bobbin guide surface that is curved to define a low-friction positioning surface allowing rotation of the coil bobbin around the second branch and support extension.

15. The transducer according to claim 10, wherein a positioning element is provided at the free end of the support extension, configured to engage a complementary positioning element in the magnetic field detector.

16. The transducer according to claim 10, wherein the magnetic field detector includes a support body comprising a connection body portion and a magnetic sensor support extension extending in an axial direction from the connection body portion, the magnetic sensor support extension comprising at a free end thereof a fixing member configured for latching to the connection body portion of the magnetic circuit and compensation coil support.

17. The transducer according to claim 16, wherein the fixing member is in the form of elastic cantilever latch arms with latching protrusions.

18. The transducer according to claim 1, wherein the compensation coil assembly comprises a coil wound around a coil bobbin, comprising at least two shell portions configured for assembly around the second branch of the magnetic circuit, the coil bobbin comprising a cylindrical central portion, a connection end flange at an axial end of the central portion and a gear flange at another axial end of the central portion, the gear flange comprising a plurality of teeth configured for coupling to a gear of a coil winding machine during assembly of the current transducer for winding the coil on the bobbin after assembly of the bobbin on the magnetic circuit.

19. The transducer according to claim 18, wherein the two bobbin portions comprise fixing elements in the form of inter-engaging latches or clips that allow the bobbin portions to be clipped together around the second branch portion of the magnetic circuit.

20. The transducer according to claim 18, wherein the connection end flange comprises a circumferential slot that serves as a temporary storage means for a starting end of the coil.

* * * * *